United States Patent
Hsu et al.

(10) Patent No.: US 11,793,094 B2
(45) Date of Patent: Oct. 17, 2023

(54) RESISTIVE MEMORY

(71) Applicant: Winbond Electronics Corp., Taichung (TW)

(72) Inventors: Po-Yen Hsu, Taichung (TW); Bo-Lun Wu, Taichung (TW); Tse-Mian Kuo, Taichung (TW)

(73) Assignee: Winbond Electronics Corp., Taichung (TW)

( * ) Notice: Subject to any disclaimer, the term of this patent is extended or adjusted under 35 U.S.C. 154(b) by 284 days.

(21) Appl. No.: 17/329,156

(22) Filed: May 25, 2021

(65) Prior Publication Data

US 2022/0173314 A1    Jun. 2, 2022

(30) Foreign Application Priority Data

Dec. 2, 2020 (TW) ................................. 109142391

(51) Int. Cl.
H10N 70/00    (2023.01)

(52) U.S. Cl.
CPC ....... *H10N 70/841* (2023.02); *H10N 70/8833* (2023.02)

(58) Field of Classification Search
CPC . H10N 70/841; H10N 70/8833; H10N 70/821
See application file for complete search history.

(56) References Cited

U.S. PATENT DOCUMENTS

| | | | |
|---|---|---|---|
| 9,653,680 B2 | 5/2017 | Pillarisetty et al. | |
| 9,773,975 B1 | 9/2017 | Chen | |
| 2011/0291066 A1* | 12/2011 | Baek | H10N 70/24 |
| | | | 257/E47.001 |
| 2016/0359108 A1* | 12/2016 | Majhi | H10N 70/8833 |
| 2017/0117463 A1* | 4/2017 | Chen | H10N 70/826 |

* cited by examiner

*Primary Examiner* — Shih Tsun A Chou
(74) *Attorney, Agent, or Firm* — JCIPRNET

(57) ABSTRACT

A resistive memory including a substrate, a first electrode, a second electrode, a resistance changeable layer and an oxygen reservoir layer is provided. The first electrode is located on the substrate. The second electrode is located between the first electrode and the substrate. The resistance changeable layer is located between the first electrode and the second electrode. The oxygen reservoir layer is located between the first electrode and the resistance changeable layer. The oxygen reservoir layer includes a first portion, a second portion and a third portion. The second portion is connected to one side of the first portion. The third portion is connected to the other side of the first portion. A thickness of the first portion is greater than a thickness of the second portion and a thickness of the third portion. The first portion of the oxygen reservoir layer protrudes toward the first electrode.

15 Claims, 1 Drawing Sheet

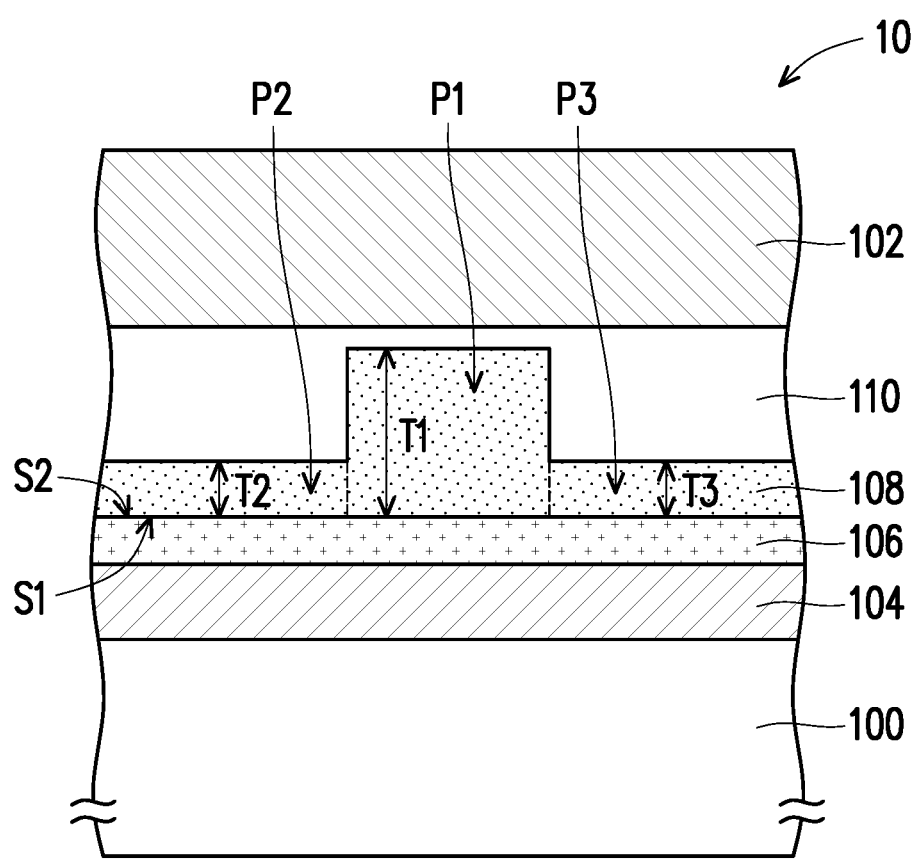

RESISTIVE MEMORY

CROSS-REFERENCE TO RELATED APPLICATION

This application claims the priority benefit of Taiwan application serial no. 109142391, filed on Dec. 2, 2020. The entirety of the above-mentioned patent application is hereby incorporated by reference herein and made a part of this specification.

BACKGROUND

Technical Field

The disclosure relates to a semiconductor device, and more particularly, to a resistive memory.

Description of Related Art

Resistive memories (such as resistive random access memory (RRAM)) are suitable for use as the next-generation memory device as they have potential advantages such as low power consumption, high-speed operation, high density, and compatibility with complementary metal oxide semiconductor (CMOS) manufacturing technology. However, how to further improve the electrical performance (for example, to stably maintain low current in high resistance state (HRS) and to increase the current in low resistance state (LRS), etc.) of a resistive memory is a goal to strive for at present.

SUMMARY

The disclosure provides a resistive memory, which effectively improves the electrical performance of a memory device.

The disclosure provides a resistive memory, including a substrate, a first electrode, a second electrode, a resistance changeable layer, and an oxygen reservoir layer. The first electrode is located on the substrate. The second electrode is located between the first electrode and the substrate. The resistance changeable layer is located between the first electrode and the second electrode. The oxygen reservoir layer is located between the first electrode and the resistance changeable layer. The oxygen reservoir layer includes a first portion, a second portion, and a third portion. The second portion is connected to one side of the first portion. The third portion is connected to the other side of the first portion. A thickness of the first portion is greater than a thickness of the second portion and a thickness of the third portion. The first portion of the oxygen reservoir layer protrudes toward the first electrode.

According to an embodiment of the disclosure, the resistive memory may further include an oxygen barrier layer. The oxygen barrier layer is located between the first electrode and the oxygen reservoir layer, the material of the oxygen barrier layer includes, for example, aluminum oxide ($Al_2O_3$), silicon dioxide ($SiO_2$), hafnium dioxide ($HfO_2$), or hafnium silicon oxynitride (HfSiON).

According to an embodiment of the disclosure, in the resistive memory, a material of the first electrode includes, for example, titanium nitride (TiN), tantalum nitride (TaN), tungsten (W), hafnium nitride (HfN), aluminum nitride (AlN), iridium (Ir), platinum (Pt), or platinum-iridium alloy (Pt/Ir), a material of the second electrode includes, for example, titanium nitride (TiN), tantalum nitride (TaN), tungsten (W), hafnium nitride (HfN), or aluminum nitride (AlN).

According to an embodiment of the disclosure, in the resistive memory, a material of the resistance changeable layer includes, for example, hafnium oxide ($HfO_2$), aluminum oxide ($Al_2O_3$), zirconium oxide ($ZrO_2$), a combination of hafnium oxide ($HfO_2$) and aluminum oxide ($Al_2O_3$), or a combination of hafnium oxide ($HfO_2$) and zirconium oxide ($ZrO_2$), a material of the oxygen reservoir layer includes, for example, titanium (Ti), tantalum (Ta), hafnium (Hf) or aluminum (Al).

According to an embodiment of the disclosure, in the resistive memory, a shape of the oxygen reservoir layer may be a reverse T shape, a lower surface of the oxygen reservoir layer faces the resistance changeable layer, and may be a flat surface, an entire lower surface of the oxygen reservoir layer and an entire upper surface of the resistance changeable layer may contact each other.

According to an embodiment of the disclosure, in the resistive memory, a ratio of the thickness of the first portion to the thickness of the second portion may be greater than 1 and less than or equal to 5, a ratio of the thickness of the first portion to the thickness of the third portion may be greater than 1 and less than or equal to 5.

According to an embodiment of the disclosure, in the resistive memory, the thickness of the first portion may be 5 nm to 250 nm, the thickness of the second portion may be 5 nm to 50 nm, the thickness of the third portion may be 5 nm to 50 nm.

Based on the above, in the resistive memory described in the disclosure, the oxygen reservoir layer includes the first portion, the second portion, and the third portion. The thickness of the first portion is greater than the thickness of the second portion and the thickness of the third portion, and the first portion of the oxygen reservoir layer protrudes toward the first electrode, thereby effectively improving the electrical performance of the memory device, as described below. After a conductive filament is formed in the resistance changeable layer, a high density of oxygen ions may be formed in the second portion and the third portion where the thickness of the oxygen reservoir layer is relatively small. Therefore, a relatively small bias voltage may be used to recombine the oxygen ions with the conductive filament during an initial RESET (hereinafter referred to as InitRST) operation. In addition, a current of LRS after a SET operation may be increased by adjusting the thickness of the first portion, the thickness of the second portion, and/or the thickness of the third portion. Furthermore, since the thickness of the second portion and the third portion of the oxygen reservoir layer is relatively small, a recombined distance between the oxygen ions and the conductive filament is reduced, thereby improving the efficiency of a RESET (hereinafter referred to as RST) operation. On the other hand, after the RST operation, since the conductive filament in the resistance changeable layer adjacent to the second portion and the third portion with relatively small thickness has a relatively small top diameter, the oxygen ions recombined to the conductive filament are unlikely to diffuse into the oxygen reservoir layer, and therefore a low current of HRS can be stably maintained. In addition, in an accelerated test performed by high-temperature baking, the resistive memory described in the disclosure has excellent reliability.

In order to make the above features and advantages of the disclosure comprehensible, embodiments accompanied with drawings are described in detail below.

BRIEF DESCRIPTION OF THE DRAWINGS

FIG. 1 is a cross-sectional view of a resistive memory according to an embodiment of the disclosure.

DETAILED DESCRIPTION OF DISCLOSED EMBODIMENTS

FIG. 1 is a cross-sectional view of a resistive memory according to an embodiment of the disclosure.

Referring to FIG. 1, a resistive memory 10 includes a substrate 100, a first electrode 102, a second electrode 104, a resistance changeable layer 106, and an oxygen reservoir layer 108. The substrate 100 may be a semiconductor substrate such as a silicon substrate. In addition, other required layers, interconnection structures, and/or devices (such as active devices) (not shown) may be provided on the substrate 100 depending on a product design.

The first electrode 102 is located on the substrate 100. The first electrode 102 may be used as a top electrode of the resistive memory 10. A material of the first electrode 102 includes, for example, titanium nitride (TiN), tantalum nitride (TaN), tungsten (W), hafnium nitride (HfN), aluminum nitride (AlN), iridium (Jr), platinum (Pt), or platinum-iridium alloy (Pt/Ir).

The second electrode 104 is located between the first electrode 102 and the substrate 100. The second electrode 104 may be used as a bottom electrode of the resistive memory 10. A material of the second electrode 104 includes, for example, titanium nitride (TiN), tantalum nitride (TaN), tungsten (W), hafnium nitride (HfN), or aluminum nitride (AlN).

The resistance changeable layer 106 is located between the first electrode 102 and the second electrode 104. A material of the resistance changeable layer 106 includes, for example, hafnium oxide ($HfO_2$), aluminum oxide ($Al_2O_3$), zirconium oxide ($ZrO_2$), a combination of hafnium oxide ($HfO_2$) and aluminum oxide ($Al_2O_3$), or a combination of hafnium oxide ($HfO_2$) and zirconium oxide ($ZrO_2$). Generally speaking, an operation of the resistive memory 10 may include the following phases, but the disclosure is not limited thereto. In a conductive filament formation phase, a conductive filament is formed in the resistance changeable layer 106, and the resistance changeable layer 106 is in LRS. In an InitRST phase, an InitRST operation is performed to convert the resistance changeable layer 106 from LRS to HRS. In a SET phase, a SET operation is performed to convert the resistance changeable layer 106 from HRS to LRS. In an RST phase, an RST operation is performed to convert the resistance changeable layer 106 from LRS to HRS.

The oxygen reservoir layer 108 is located between the first electrode 102 and the resistance changeable 106. A lower surface S1 of the oxygen reservoir layer 108 faces the resistance changeable layer 106, and may be a flat surface. In addition, the entire lower surface S1 of the oxygen reservoir layer 108 and an entire upper surface S2 of the resistance changeable layer 106 may contact each other, thereby increasing a formation range of the conductive filament. A material of the oxygen reservoir layer 108 includes, for example, titanium (Ti), tantalum (Ta), hafnium (Hf), or aluminum (Al).

The oxygen reservoir layer 108 includes a first portion P1, a second portion P2, and a third portion P3. The second portion P2 is connected to one side of the first portion P1. The third portion P3 is connected to the other side of the first portion P1. A thickness T1 of the first portion P1 is greater than a thickness T2 of the second portion P2 and a thickness T3 of the third portion P3. The first portion P1 of the oxygen reservoir layer 108 protrudes toward the first electrode 102. In this way, a shape of the oxygen reservoir layer 108 may be a reverse T shape. In some embodiments, the second portion P2 and the third portion P3 may be connected to form a ring to surround a sidewall of the first portion P1. A ratio of the thickness T1 of the first portion P1 to the thickness T2 of the second portion P2 may be greater than 1 and less than or equal to 5. A ratio of the thickness T1 of the first portion P1 to the thickness T3 of the third portion P3 may be greater than 1 and less than or equal to 5. For example, the thickness T1 of the first portion P1 may be 5 nm to 250 nm, while the thickness T2 of the second portion P2 may be 5 nm to 50 nm, and the thickness T3 of the third portion P3 may be 5 nm to 50 nm.

In addition, the resistive memory 10 may further include an oxygen barrier layer 110. The oxygen barrier layer 110 is located between the first electrode 102 and the oxygen reservoir layer 108. A material of the oxygen barrier layer 110 includes, for example, aluminum oxide ($Al_2O_3$), silicon dioxide ($SiO_2$), hafnium dioxide ($HfO_2$), or hafnium silicon oxynitride (HfSiON).

Based on the above embodiment, in the resistive memory 10, the oxygen reservoir layer 108 includes the first portion P1, the second portion P2, and the third portion P3. The thickness T1 of the first portion P1 is greater than the thickness T2 of the second portion P2 and the thickness T3 of the third portion P3, and the first portion P1 of the oxygen reservoir layer 108 protrudes toward the first electrode 102, thereby effectively improving the electrical performance of a memory device, as described below.

After the conductive filament is formed in the resistance changeable layer 106, a high density of oxygen ions may be formed in the second portion P2 and the third portion P3 where the thickness of the oxygen reservoir layer 108 is relatively small. Therefore, a relatively small bias voltage may be used to recombine the oxygen ions with the conductive filament during the InitRST operation.

In addition, a current of LRS after the SET operation may be increased by adjusting the thickness T1 of the first portion P1, the thickness T2 of the second portion P2, and/or the thickness T3 of the third portion P3.

Furthermore, when the RST operation is performed, since the thickness of the second portion P2 and the third portion P3 of the oxygen reservoir layer 108 is relatively small, a recombined distance between the oxygen ions and the conductive filament is reduced, thereby improving the efficiency of the RST operation.

On the other hand, since the thickness T1 of the first portion P1 is greater than the thickness T2 of the second portion P2 and the thickness T3 of the third portion P3, conductive filaments of different sizes may be formed in the resistance changeable layer 106. The conductive filament in the resistance changeable layer 106 adjacent to the second portion P2 and the third portion P3 with relatively small thickness has a relatively small top diameter, and the conductive filament in the resistance changeable layer 106 adjacent to the first portion P1 with relatively large thickness has a relatively large top diameter. After the RST operation is performed, since the conductive filament in the resistance changeable layer 106 adjacent to the second portion P2 and the third portion P3 with relatively small thickness has a relatively small top diameter, the oxygen ions recombined to the conductive filament are unlikely to diffuse into the oxygen reservoir layer 108, and therefore a low current of HRS can be stably maintained.

On the other hand, in an accelerated test performed by high-temperature baking, the resistive memory 10 has excellent reliability.

In summary, in the resistive memory described in the above embodiments, the thickness of the first portion is greater than the thickness of the second portion and the thickness of the third portion, and the first portion of the oxygen reservoir layer protrudes toward the first electrode, thereby effectively improving the electrical performance of the memory device.

Although the disclosure has been described with reference to the above embodiments, they are not intended to limit the disclosure. It will be apparent to one of ordinary skill in the art that modifications to the described embodiments may be made without departing from the spirit and the scope of the disclosure. Accordingly, the scope of the disclosure will be defined by the attached claims and their equivalents and not by the above detailed descriptions.

What is claimed is:

1. A resistive memory, comprising:
   a substrate;
   a first electrode located on the substrate;
   a second electrode located between the first electrode and the substrate;
   a resistance changeable layer located between the first electrode and the second electrode; and
   an oxygen reservoir layer located between the first electrode and the resistance changeable layer, the oxygen reservoir layer comprising:
   a first portion;
   a second portion connected to one side of the first portion; and
   a third portion connected to another side of the first portion, wherein a thickness of the first portion is greater than a thickness of the second portion and a thickness of the third portion, the first portion of the oxygen reservoir layer protrudes toward the first electrode, and a top surface of the first portion is further away from a planar top surface of the resistance changeable layer than a top surface of the second portion and a top surface of the third portion.

2. The resistive memory according to claim 1, further comprising:
   an oxygen barrier layer located between the first electrode and the oxygen reservoir layer.

3. The resistive memory according to claim 2, wherein a material of the oxygen barrier layer comprises aluminum oxide ($Al_2O_3$), silicon dioxide ($SiO_2$), hafnium dioxide ($HfO_2$), or hafnium silicon oxynitride (HfSiON).

4. The resistive memory according to claim 1, wherein a material of the first electrode comprises titanium nitride (TiN), tantalum nitride (TaN), tungsten (W), hafnium nitride (HfN), aluminum nitride (AlN), iridium (Ir), platinum (Pt), or platinum-iridium alloy (Pt/Ir).

5. The resistive memory according to claim 1, wherein a material of the second electrode comprises titanium nitride (TiN), tantalum nitride (TaN), tungsten (W), hafnium nitride (HfN), or aluminum nitride (AlN).

6. The resistive memory according to claim 1, wherein a material of the resistance changeable layer comprises hafnium oxide ($HfO_2$), aluminum oxide ($Al_2O_3$), zirconium oxide ($ZrO_2$), a combination of hafnium oxide ($HfO_2$) and aluminum oxide ($Al_2O_3$), or a combination of hafnium oxide ($HfO_2$) and zirconium oxide ($ZrO_2$).

7. The resistive memory according to claim 1, wherein a material of the oxygen reservoir layer comprises titanium (Ti), tantalum (Ta), hafnium (Hf) or aluminum (Al).

8. The resistive memory according to claim 1, wherein a shape of the oxygen reservoir layer comprises a reverse T shape.

9. The resistive memory according to claim 1, wherein a lower surface of the oxygen reservoir layer faces the resistance changeable layer and is a flat surface.

10. The resistive memory according to claim 1, wherein an entire lower surface of the oxygen reservoir layer and an entire upper surface of the resistance changeable layer contact each other.

11. The resistive memory according to claim 1, wherein a ratio of the thickness of the first portion to the thickness of the second portion is greater than 1 and less than or equal to 5.

12. The resistive memory according to claim 1, wherein a ratio of the thickness of the first portion to the thickness of the third portion is greater than 1 and less than or equal to 5.

13. The resistive memory according to claim 1, wherein the thickness of the first portion is 5 nm to 250 nm.

14. The resistive memory according to claim 1, wherein the thickness of the second portion is 5 nm to 50 nm.

15. The resistive memory according to claim 1, wherein the thickness of the third portion is 5 nm to 50 nm.

* * * * *